United States Patent

Kawata et al.

Patent Number: 5,567,990
Date of Patent: Oct. 22, 1996

[54] RESIN-ENCAPSULATED SEMICONDUCTOR DEVICE

[75] Inventors: Tatsuo Kawata, Shimodate; Hiroshi Suzuki, Hitachi; Hiroki Sashima, Shimodate; Kazuhiko Miyabayashi, Shimodate; Osamu Horie, Shimodate, all of Japan

[73] Assignee: Hitachi Chemical Company, Ltd., Tokyo, Japan

[21] Appl. No.: 511,866

[22] Filed: Aug. 7, 1995

[30] Foreign Application Priority Data

Aug. 11, 1994 [JP] Japan .................................. 6-189686

[51] Int. Cl.$^6$ .............................................. H01L 23/29
[52] U.S. Cl. ........................... 257/788; 257/793; 257/795
[58] Field of Search .................................. 257/788, 793, 257/795

[56] References Cited

U.S. PATENT DOCUMENTS 5,294,835 3/1994 Igarashi et al. ......................... 257/793

Primary Examiner—William Mintel
Assistant Examiner—Roy Potter
Attorney, Agent, or Firm—Antonelli, Terry, Stout & Kraus

[57] ABSTRACT

A resin-encapsulated semiconductor which is free from the occurrence of blisters or cracks during soldering, suits for continuous production and has excellent moisture resistance reliability is obtained by using an epoxy resin encapsulating material which comprises (A) an epoxy resin component, (B) a curing agent represented by the following general formula (II),

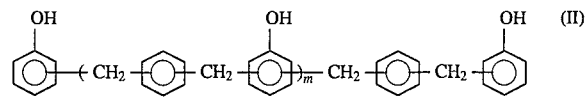

wherein m is a number of 0 to 30, (C) at least one cure accelerator selected from the group consisting of compounds represented by the following formulae (III) and (IV),

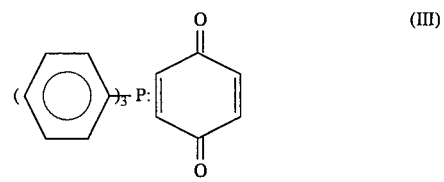

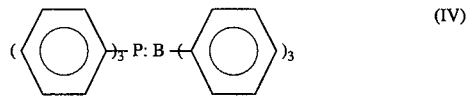

(D) a release agent selected from the group consisting of a polyethylene wax or a mixture thereof with carnauba wax and a mixture of a polyethylene wax or a montanic ester wax, and (E) 65 to 90% by volume of fused silica as a filler.

4 Claims, No Drawings

RESIN-ENCAPSULATED SEMICONDUCTOR DEVICE

BACKGROUND OF THE INVENTION (a) Field of the Invention

The present invention relates to thin, resin-encapsulated semiconductor devices for surface mounting wherein large scale Si chips are encapsulated.

(b) Description of the Related Art

Semiconductor elements such as IC and LSI are being scaled up as the degree of integration increases, while resin-encapsulated semiconductor devices are being increasingly down sized and thinned. Further, in recent methods for mounting semiconductor devices on boards, the semiconductor devices themselves are heated rapidly to high temperatures of 200° C. or higher. At that time, water contained in resin encapsulating materials evaporates, and the vapor pressure acts as separating stress between the resin encapsulating materials and insert members, such as the semiconductor devices or lead frames, to cause separation between the resin encapsulating materials and the insert elements, and particularly, in thin and flat package type resin-encapsulated semiconductor devices, to cause blisters or cracks. There have been some attempts to solve such problems. For example, conventional resin encapsulating materials containing as a filler for decreasing moisture absorption 50 to 60% by volume of crystalline silica, fused silica or a mixture thereof are replaced by resin encapsulating materials containing as the filler 65 to 90% by volume of fused silica alone. It is also attempted to improve adhesion to insert elements by replacing the o-cresol novolac epoxy resins contained in conventional resin encapsulating materials with the epoxy resins represented by the following general formula (I) or a mixture thereof with o-cresol novolac, or by replacing the phenolic novolac resins used as curing agents in conventional resin encapsulating materials with the aralkyl phenolic resins represented by the following general formula (II).

The occurrence of blisters and cracks during soldering is prevented in the thin resin-encapsulated semiconductor devices encapsulated by such resin encapsulating materials, which however are poor in releasability and storage stability, so that they are difficult to mold continuously and are unreliable in moisture resistance due to voids occurring on their surfaces.

SUMMARY OF THE INVENTION

The object of the present invention is to provide a thin, resin-encapsulated semiconductor device for surface mounting which is free from the occurrence of blisters or cracks during soldering and has excellent moisture resistance reliability.

That is, the present invention provides a thin, resin-encapsulated semiconductor device for surface mounting wherein a Si chip type element is encapsulated by molding an epoxy resin encapsulating material, wherein the Si chip is at least 25 mm$^2$ in area or has a side of at least 5 mm in length, the package is not more than 3 mm in thickness, and the epoxy resin encapsulating material comprises (A) an epoxy resin component comprising an epoxy resin represented by the following general formula (I),

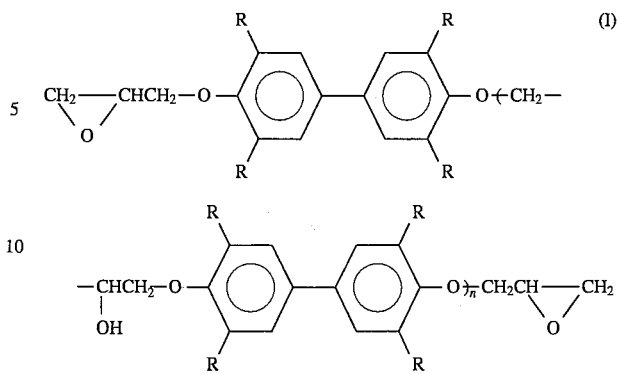

wherein R is H or CH$_3$, and n is a number of 0 to 3, (B) a curing agent represented by the following general formula (II),

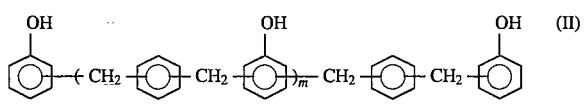

wherein m is a number of 0 to 30, (C) at least one cure accelerator selected from the group consisting of a compound represented by the following formula (III) and a compound represented by the following formula (IV),

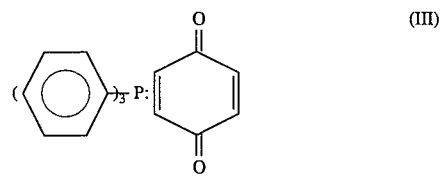

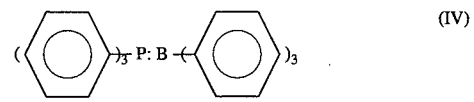

(D) a release agent selected from the group consisting of a polyethylene wax, a mixture of a polyethylene wax and carnauba wax and a mixture of a polyethylene wax and a montanic ester wax, and (E) fused silica as a filler, the fused silica being 65 to 90% by volume of the epoxy resin encapsulating material.

DESCRIPTION OF THE PREFERRED EMBODIMENTS

The preferred epoxy resin represented by the general formula (I) is one wherein all substituents represented by R are CH$_3$. According to demands, the epoxy resin component of the epoxy resin encapsulating material to be used in the present invention may contain epoxy resins other than the epoxy resin represented by the general formula (I). Some examples of the other epoxy resins include brominated epoxy resins, such as brominated epi-bis epoxy resin. In case where the epoxy resin encapsulating material contains the epoxy resin represented by the general formula (I) and other epoxy resins, the total amounts of such other epoxy resins is preferably not more than 30% by weight, more preferably not more than 15% by weight of the epoxy resin component.

In the general formula (II) representing the curing agent to be used in the present invention, m is a number of 0 to 30, preferably 2 to 10. The amount of the curing agent in the epoxy resin encapsulating material of the present invention is generally such that the ratio of the epoxy equivalents of the epoxy resin component/the OH equivalents of the curing agent ranges from 0.8 to 1.2, preferably from 0.9 to 1.1.

According to the present invention, instead of carnauba wax and montanic ester wax which have conventionally been used as release agents, polyethylene wax is used alone or together with carnauba wax or montanic ester wax, to improve releasability and continuous moldability. The amount of the release agent used in the epoxy resin encapsulating material of the present invention is generally 0.5 to 5 parts by weight, preferably 3 to 5 parts by weight, per 100 parts by weight of the epoxy resin component.

Resin encapsulating materials having poor storage stability will be lowered in flowability and become difficult to continuously mold. The epoxy resin encapsulating material of the present invention is improved in storage stability by replacing conventional cure accelerators, such as triphenyl phosphine or imidazoles, with a cure accelerator having potentiality, namely at least one selected from the compounds represented by the general formulae (III) and (IV). A curing accelerator having potentiality means that the activation energy of the curing accelerator has an inflection point and that it reacts slowly at low temperatures but reacts fast at high temperatures.

The voids on the surfaces of the conventional resin-encapsulated semiconductor devices seem to occur for the reason that a part of the conventional cure accelerators, such as triphenyl phosphine or imidazoles, are oxidized during molding at a mold temperature of 170° to 180° C. to loose catalytic activity and leave uncured spots as the voids. The cure accelerator used in the present invention is difficult to oxidize and prevents the occurrence of voids, thereby providing resin-encapsulated semiconductor devices having excellent moisture resistance reliability.

The amount of the cure accelerator is generally 0.1 to 10 parts by weight, preferably 3 to 7 parts by weight, per 100 parts by weight of the epoxy resin component.

The epoxy resin encapsulating material used in the present invention may contain other additives, for example colorants, such as carbon black, silane coupling agents and fire retardants, such as antimony trioxide. The amount of colorants is preferably 2 to 5 parts by weight per 100 parts by weight of the epoxy resin component. The amount of the silane coupling agents is preferably 3 to 20 parts by weight per 100 parts by weight of the epoxy resin component. The amount of the fire retardants is preferably 4 to 20 parts by weight per 100 parts by weight of the epoxy resin component.

The thin resin-encapsulated semiconductor device of the present invention is produced by molding the resin encapsulating material with a Si chip type element inserted therein. The Si chip of the Si chip type element is at least 25 mm$^2$, preferably 25 to 900 mm$^2$ in area, or has a side of at least 5 mm, preferably 5 to 30 mm in length. The package is not more than 3 mm, preferably 0.5 to 3.0 mm in thickness. An example of the thin resin-encapsulated semiconductor device of the present invention is a flat package type semiconductor device having leads protruding out of the four edges of the package.

The method of molding is not particularly limited. The preferred method is transfer molding which is suitable for continuous molding.

The conditions of molding is generally a mold temperature of 160° to 200° C., preferably 170 to 180° C., a pressure of 50 to 250 kgf/cm$^2$, preferably 70 to 150 kgf/cm$^2$, and curing time of 30 to 180 seconds, preferably 45 to 120 seconds.

The resin encapsulating material used in the present invention is suitable for continuous molding because of its good releasability and high storage stability. Also, the resin package produced by using the above-described resin encapsulating material has a low water content and high adhesion to the insert elements, so that the resin-encapsulated semiconductor device of the present invention is free from the occurrence of blisters or cracks at the time of soldering and also has no voids on its surface. The resin-encapsulated semiconductor device of the present invention has high productivity and exhibits excellent moisture resistance reliability.

Hereinafter, the present invention is described in detail referring to Examples, which however do not limit the scope of the present invention.

EXAMPLES 1 TO 3 AND COMPARATIVE EXAMPLES 1 TO 5

In each of Examples and Comparative Examples, the materials listed in Table 1 were mixed by dry blending and were then kneaded by using a two-axle roll (surface temperature of the rolls: about 80° C.) for ten minutes, and the mixture was cooled and ground to obtain an epoxy resin encapsulating material.

The epoxy resin encapsulating material was molded by using a transfer molding press at a mold temperature of 180° C., at a molding pressure of 70 kgf/cm$^3$, for a curing time of 90 seconds, to measure the spiral flow (SF) of the epoxy resin encapsulating material according to EMMI 1-66. The storage stability of the epoxy resin encapsulating material was evaluated by cooling the kneaded epoxy resin encapsulating material by allowing it to stand at room temperature (common storage temperature is 5° C. or lower) for 24 hours and storing it at room temperature to measure the storage time taken for 10% decrease (90% preservation) in SF. The evaluation of releasability (continuous moldability) was conducted by carrying out continuous molding under the same molding conditions as described above by using an auto-molding machine ATOM-100PF (Trade name, produced by MTEX Matsumura Corp., locking pressure: 50 ton) to mold packages [PKG (package type): SOP20P, L/F(lead frame): Cu, package size: 12.8 mm×55 mm×1.9 mm] without semiconductor chips. During continuous molding, resin encapsulating materials with poor releasability cause sticking of packages to the upper mold or the separation of cull.

Also, resin-encapsulated semiconductor devices were produced by molding the epoxy resin encapsulating material with a semiconductor element inserted therein by using a transfer molding press under the same molding conditions as described above, and after after-curing was completed at 175° C. for 6 hours, the presence of voids of 0.1 mm or larger on the packages were observed by using a stereomicroscope. The obtained resin-encapsulated semiconductor devices were then subjected to the evaluation of soldering package cracking and the moisture resistance reliability. The resin-encapsulated semiconductor devices were of a QFP82P type (external sizes of 20 mm×14 mm×2.0 mm) wherein the lead frame is 42 alloy and the chip sizes were 8 mm×10 mm. Each chip had Al wiring of 15 μm in width and 5 μm in gap and was not surface passivated. After the observation of voids, the resin-encapsulated semiconductor devices were baked at 125° C. for 24 hours and were then allowed to stand at 85° C. at 85%RH for a predetermined time. Thereafter, the resin-encapsulated semiconductor devices were treated at 215° C. for 90 seconds to obtain the percentage of the occurrence of package cracking. The test of moisture resistance reliability was conducted on those without package cracking. After standing in PCT (121° C., 2 arm) for 1,000 hours, moisture resistance reliability was evaluated by conducting continuity test to examine the disconnection of Al wires due to corrosion. The results of these tests are listed in Table 2.

resin-encapsulated semiconductor devices were as follows: PKG: QFP82P (external sizes: 20 mm×14 mm×2.0 mm), L/F: 42 alloy, chip sizes: 8 mm×10 mm (Al wiring: 15 μm in width, 5 μm in gap, without passivation), diameter of Au wire: 25 μm).

*3 Cracking during soldering

After the observation of voids, the resin-encapsulated semiconductor devices were subjected sequentially to baking at 125° C. for 24 hours, moistening at 85° C./85%RH for 48 hours and heat treatment at 215° C. for 90 seconds, and then the presence of cracks on the packages was observed.

TABLE 1

|  | unit | Example Nos. | | | Comparative Example Nos. | | | | |
|---|---|---|---|---|---|---|---|---|---|
|  |  | 1 | 2 | 3 | 1 | 2 | 3 | 4 | 5 |
| Epoxy resin A *1 | (wt part) | 85 | 85 | 85 | 85 | 85 | 85 | 85 | 85 |
| Brominated epi - bis epoxy resin | (wt part) | 15 | 15 | 15 | 15 | 15 | 15 | 15 | 15 |
| Curing agent B *2 | (wt part) | 84 | 84 | 84 | 84 | 84 | 84 | 84 | 84 |
| Cure accelerator C *3 | (wt part) | 3.5 | 3.5 | 2.5 | — | — | 3.5 | 2.5 | 3.5 |
| Cure accelerator D *4 | (wt part) | — | — | 3.5 | — | — | — | 3.5 | — |
| Triphenyl phosphine | (wt part) | — | — | — | 2.0 | 2.0 | — | — | — |
| Polyethylene wax | (wt part) | 2.0 | 2.0 | 2.0 | — | 2.0 | — | — | 2.0 |
| Caurauba wax | (wt part) | — | 1.0 | 1.0 | 3.0 | 1.0 | 3.0 | 3.0 | — |
| Antimony trioxide | (wt part) | 6.0 | 6.0 | 6.0 | 6.0 | 6.0 | 6.0 | 6.0 | 6.0 |
| Carbon black | (wt part) | 2.5 | 2.5 | 2.5 | 2.5 | 2.5 | 2.5 | 2.5 | 2.5 |
| Silane coupling agent | (wt part) | 4.0 | 4.0 | 4.0 | 4.0 | 4.0 | 4.0 | 4.0 | 4.0 |
| Fused silica | (wt part) | 1130 | 1135 | 1150 | 1125 | 1125 | 1135 | 1150 | 640 |
| Amont of filler | vol % | 75 | 75 | 75 | 75 | 75 | 75 | 75 | 63 |

Note
*1 An epoxy resin represented by the formula (I) (R = CH$_3$, n = 1) (epoxy equivalent weight: about 190)
*2 A curing agent represented by the formula (II) (m = 3) (OH equivalent weight: about 175)
*3 A cure accelerator represented by the formula (III)
*4 A cure accelerator represented by the formula (IV)

TABLE 2

|  | Unit | Example Nos. | | | Comparative Example Nos. | | | | |
|---|---|---|---|---|---|---|---|---|---|
|  |  | 1 | 2 | 3 | 1 | 2 | 3 | 4 | 5 |
| Spiral flow rate (SF) | inch | 30 | 30 | 35 | 25 | 25 | 30 | 35 | 20 |
| Storage stability (SF10%-decrease, 90%-preservation) | hr | 36 | 36 | 60 | 24 | 24 | 36 | 60 | 36 |
| Releasabiltiy (continuous moldabiltiy) *1 | Number of shots | ≧300 | ≧300 | ≧300 | 20 | ≧300 | 25 | 25 | ≧300 |
| Voids *2 | Number of PKG having voids/number of PKG | 0/20 | 0/20 | 0/20 | 10/20 | 12/20 | 0/20 | 0/20 | 0/20 |
| Soldering cracking *3 | Number of cracked PKG/Number of PKG | 0/20 | 0/20 | 0/20 | 0/20 | 0/20 | 0/20 | 0/20 | 20/20 |
| Moisture resistance reliability (PCT1000h) | Number of disconnected PKG/number of PKG | 0/20 | 0/20 | 0/20 | 5/20 | 6/20 | 0/20 | 0/20 | — |

*1Releasability (Continuous moldability)

Molding (PKG: SOP20P, L/F: Cu, package size: 12.8 mm×5.5 mm×1.9 mm) was carried out by using an auto-molding machine (ATOM-100PF: locking pressure: 50 ton, produced by MTEX Matsumura Corp.) without inserting chip elements under molding conditions of 180° C./90 sec. During continuous molding, the number of shots wherein sticking of packages to upper mold or the separation of cull occurred was counted.

*2 Voids

Resin-encapsulated semiconductor devices were molded by using a transfer molding press under molding conditions of 180° C./90 sec, and after after-curing of 175° C./6 h, the presence of voids of 0.1 mm or larger on the packages was observed by using a stereomicroscope. The structure of the

*4 Moisture resistance reliability

After the test of soldering cracking, resin-encapsulated semiconductor devices on which no cracks were observed were subjected to a test of moisture resistance reliability in PCT for 1,000 hours at 121° C./2 arm, and were then subjected to continuity test to examine the disconnection of Al wires due to corrosion.

What is claimed is:

1. A thin, resin-encapsulated semiconductor device for surface mounting wherein a Si chip type element is encapsulated in a package by molding an epoxy resin encapsulating material, wherein the Si chip is at least 25 mm$^2$ in area or has a side of at least 5 mm in length, the package is not more than 3 mm in thickness, and the epoxy resin encapsulating material comprises (A) an epoxy resin component comprising an epoxy resin represented by the following general formula (I),

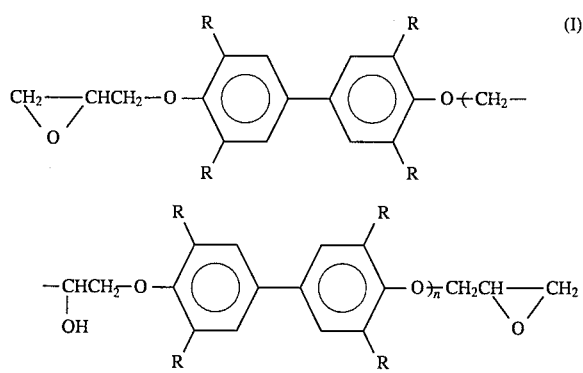

wherein R is H or CH$_3$, and n is a number of 0 to 3, (B) a curing agent represented by the following general formula (II),

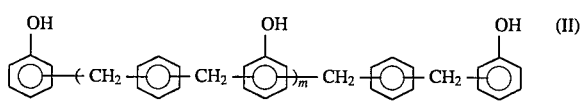

wherein m is a number of 0 to 30, (C) at least one cure accelerator selected from the group consisting of a compound represented by the following formula (III) and a compound represented by the following formula (IV),

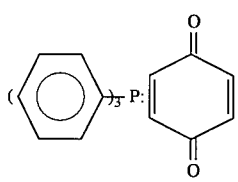

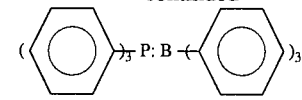

(D) a release agent selected from the group consisting of a polyethylene wax, a mixture of a polyethylene wax and carnauba wax and a mixture of a polyethylene wax and a montanic ester wax, and (E) fused silica as a filler, the fused silica being 65 to 90% by volume of the epoxy resin encapsulating material.

2. The resin-encapsulated semiconductor device of claim 1, wherein the epoxy resin component and the curing agent are in a ratio of epoxy equivalents of the epoxy resin component/OH equivalents of the curing agent ranging from 0.8 to 1.2, the cure accelerator is 0.1 to 10 parts by weight and the release agent is 0.5 to 5 parts by weight, both per 100 parts by weight of the epoxy resin component.

3. The resin-encapsulated semiconductor device of claim 1, wherein the epoxy resin component is a mixture of 70 to 100% by weight of the epoxy resin represented by the general formula (I) and 0 to 30% by weight of a brominated epoxy resin.

4. The resin-encapsulated semiconductor device of claim 1 which further contains a fire retardant, a colorant and a silane coupling agent.

* * * * *